(12) United States Patent
Yabuuchi

(10) Patent No.: US 10,937,475 B1
(45) Date of Patent: Mar. 2, 2021

(54) CONTENT ADDRESSABLE MEMORY

(71) Applicant: RENESAS ELECTRONICS CORPORATION, Tokyo (JP)

(72) Inventor: Makoto Yabuuchi, Tokyo (JP)

(73) Assignee: RENESAS ELELCTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/662,167

(22) Filed: Oct. 24, 2019

(51) Int. Cl.
*G11C 15/04* (2006.01)
*G11C 7/22* (2006.01)
*G11C 7/06* (2006.01)

(52) U.S. Cl.
CPC .............. *G11C 7/227* (2013.01); *G11C 7/06* (2013.01); *G11C 15/04* (2013.01); *G11C 15/043* (2013.01)

(58) Field of Classification Search
CPC ........... G11C 7/227; G11C 7/06; G11C 15/04; G11C 15/043
See application file for complete search history.

(56) References Cited

U.S. PATENT DOCUMENTS

| 7,382,638 | B2* | 6/2008 | Ma | G11C 7/06 365/189.07 |
| 8,730,750 | B1* | 5/2014 | Trivedi | G11C 7/227 365/210.1 |
| 2018/0340978 | A1 | 11/2018 | Yabuuchi et al. | |

FOREIGN PATENT DOCUMENTS

JP 2018-198104 A 12/2018

* cited by examiner

*Primary Examiner* — Vanthu T Nguyen
(74) *Attorney, Agent, or Firm* — McDermott Will & Emery LLP

(57) ABSTRACT

A TCAM (Ternary Content Addressable Memory) according to the embodiment includes repeaters in a delay path for controlling the timing in the replica circuit that defines the timing of matching. According to the above configuration, the TCAM which consumes low power and operates at high speed can be realized.

4 Claims, 10 Drawing Sheets

FIG. 2

| SRAM Cell (X Cell) | SRAM Cell (Y Cell) | TCAM Cell Data |
|---|---|---|
| "1" | "0" | "0" |
| "0" | "1" | "1" |
| "0" | "0" | "x" (don't care) |
| "1" | "1" | Not Used |

CONTENT ADDRESSABLE MEMORY

BACKGROUND

The present disclosure relates to a memory and a semiconductor device including the same, and is particularly applicable to a content addressable memory that can be incorporated in a semiconductor device and a semiconductor device that incorporates the content addressable memory. Japanese unexamined patent publication No. 2018-198104 discloses an exemplary configuration of a TCAM.

SUMMARY

In a semiconductor device, a smaller area is realized by miniaturizing a processing process, while a wiring resistance is increased by narrowing a width of the wiring. A TCAM mounted on a semiconductor device to which microfabrication processes are applied may cause an increase in power consumed or a decrease in operation speed due to a magnitude of a wire resistor.

Other objects and novel features will become apparent from the description of this specification and the accompanying drawings.

The typical aspects of the present disclosure will be briefly described below. That is, the TCAM according to the embodiment includes repeaters in a delay path for controlling the timings in the replica circuit that defines the timings of matching.

According to the above configuration, a TCAM which consumes low power and operates at high speed can be realized.

BRIEF DESCRIPTION OF THE DRAWINGS

FIG. 2 is a diagram showing the relationship between the stored content of the SRAM cell and the data of the TCAM cell.

DETAILED DESCRIPTION

Figure 1:
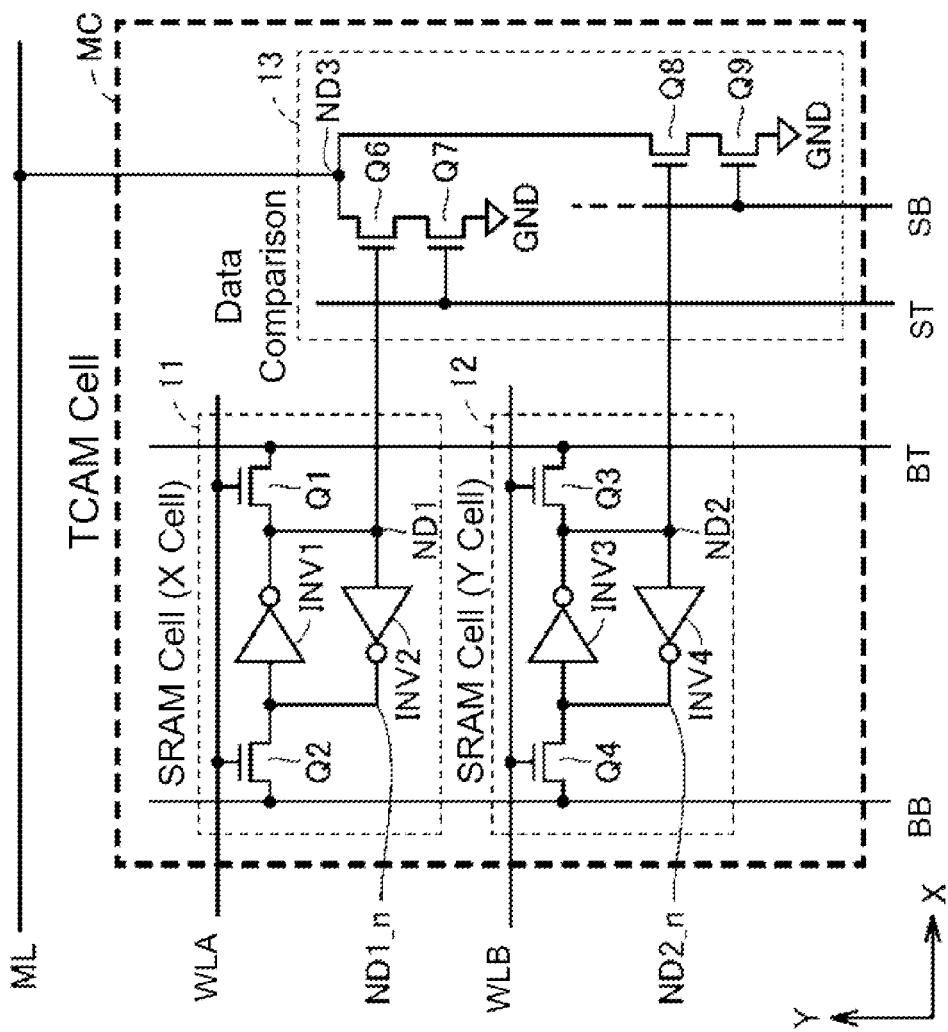
FIG. 1 is a block diagram showing a main part of the TCAM according to the first embodiment.

Embodiments and examples will be described below with reference to the drawings. In the specification and the drawings, the same or corresponding components are denoted by the same reference numerals, and a repetitive description thereof may be omitted. In the drawings, for convenience of description, the configuration may be omitted or simplified. Also, at least some of the embodiments and variations may be arbitrarily combined with each other.

Embodiment 1

(TCAM Cell Configuration)

FIG. 1 is a circuit diagram showing a configuration of a main part of the TCAM cell according to the first embodiment. The TCAM 1 is a semiconductor integrated circuit, and is composed of a circuit formed on a semiconductor substrate (semiconductor chip) such as a single-crystal silicon substrate (semiconductor chip) using known CMOS manufacturing processes.

The TCAM cell MC (also referred to as a memory cell or a bitcell) includes two SRAM cells (Static Random Access Memory Cell) 11 and 12 and a data comparator 13. The SRAM cell 11 is also referred to as an X cell, and the SRAM cell 12 is also referred to as a Y cell. The X cell 11 stores data of one bit complementary to each other (data of the other bit becomes "0" when one node is "1") in the pair of internal storage nodes ND1 and ND1_$n$. The Y cell 12 stores one-bit data complementary to each other in the pair of storage nodes ND2 and ND2_$n$.

The TCAM cell is connected to a pair of bit lines BT and BB, a pair of search lines ST and SB, a match line ML, and word lines WLA and WLB. The bit-line pair BT, BB extends in the column direction (Y direction) of the TCAM cell array 20 of FIG. 3, which will be described later, and is shared by a plurality of TCAM cells arranged in the column direction. The pair of search lines ST and SB extends in the column direction (Y direction) of the TCAM cell array 20, and the pair of search lines ST and SB is shared by a plurality of TCAM cells arranged in the column direction.

The match line ML extends in the row direction (X direction) of the TCAM cell array 20, and the match line ML is shared by a plurality of TCAM cells arranged in the row direction. The word lines WLA and WLB extend in the row direction (X direction) of the TCAM cell array 20, and the word lines WLA and WLB are shared by a plurality of TCAM cells arranged in the row direction. The word lines WLA and WLB may be referred to as a first word line and a second word line.

The X cell 11 includes inverters INV1, INV2, N-channel MOS (Metal Oxide Semiconductor) transistors Q1 and Q2. The inverter INV1 is connected between the storage node ND1 and the storage node ND1_$n$ so that the direction from the storage node ND1_$n$ to the storage node ND1 becomes the forward direction. The inverter INV2 is connected in parallel and in opposite directions to the INV1. The MOS transistor Q1 is connected between the storage node ND1 and the bit line BT. The MOS transistor Q2 is connected between the storage node ND1_$n$ and the bit line BB. The gates of the MOS transistors Q1 and Q2 are connected to the word line WLA.

The Y cell 12 includes an inverters INV3, INV4, MOS (Metal Oxide Semiconductor) transistors Q3 and Q4. The inverter INV3 is connected between the storage node ND2 and the storage node ND2_$n$ so that the direction from the storage node ND2_$n$ toward the storage node ND2 becomes the forward direction. The inverter INV4 is connected in parallel and in opposite directions to the INV3. The MOS transistor Q3 is connected between the storage node ND2 and the bit line BT. The MOS transistor Q4 is connected between the storage node ND2_$n$ and the bit line BB. The gates of the MOS transistors Q3 and Q4 are connected to the word line WLB.

The data comparison unit 13 includes N-channel MOS transistors Q6 to Q9. The MOS transistors Q6 and Q7 are connected in series between a node ND3, which is a node connecting the MOS transistors Q6 and Q7 to the match line ML, and a grounding node GND. The MOS transistors Q8 and Q9 are connected in series between the node ND3 and the grounding node GND, and are connected in parallel with all of the MOS transistors Q6 and Q7 connected in series. The gates of the MOS transistors Q6 and Q8 are connected to the storage nodes ND1,ND2, respectively. The gates of MOS transistors Q7 and Q9 are connected to search lines ST and SB, respectively.

When the memory cell is BCAM, for example, in FIG. 1, the word-line WLB and the word-line Y-cell are deleted, and the gate electrode of the MOS transistor Q8 is connected to the storage node ND 1-$n$ of the X-cell.

FIG. 2 is a table showing the correspondences between the storage contents of the X cell and the Y cell of FIG. 1 and the data of the TCAM cell.

Referring to FIGS. 1 and 2, a TCAM cell can store three values of "0", "1", and "x" (don't care: don't care) using a 2-bit SRAM cell. More specifically, when "1" is stored in the storage node ND1 of the X cell 11 and "0" is stored in the storage node ND2 of the Y cell 12, it is assumed that "0" is stored in the TCAM cell. When "0" is stored in the storage node ND1 of the X cell 11 and "1" is stored in the storage node ND2 of the Y cell 12, it is assumed that "1" is stored in the TCAM cell. It is assumed that "x" (don't care) is stored in the TCAM cell when "0" is stored in the storage node ND1 of the X cell 11 and "0" is stored in the storage node ND2 of the Y cell 12. It is not used when "1" is stored in the storage node ND1 of the X cell 11 and "1" is stored in the storage node ND2 of the Y cell 12.

According to the configuration of the TCAM cell described above, when the search data is "1" (i.e., the search line ST is "1" and the search line SB is "0") and the TCAM data is "0" (the storage node ND1 is "1" and the storage node ND2 is "0"), the MOS transistors Q6 and Q7 are turned on, so that the potential of the precharged match line ML is pulled out to the ground potential. When the search data is "0" (i.e., the search line SL is "0" and the search line SL-n is "1") and the TCAM data is "1" (the storage node ND1 is "0" and the storage node ND2 is "1"), the MOS transistors Q8 and Q9 are turned on, so that the potential of the precharged match line ML is pulled out to the ground potential. That is, when the search data and the TCAM data do not coincide with each other, the potential of the match line ML is pulled out to the grounding potential.

Conversely, when the inputted search data is "1" and the TCAM data is "1" or "x", or when the search data is "0" and the TCAM data is "0" or "X" (that is, when both are coincident), the potential of the pre-charged match line ML (power supply potential VDD level) is maintained.

As described above, in the TCAM, the charges stored in the match line ML are extracted as long as the data of all the TCAM cells connected to the match line ML corresponding to at least one entry (row) does not coincide with the inputted search data.

(Array Configuration)

Figure 3:
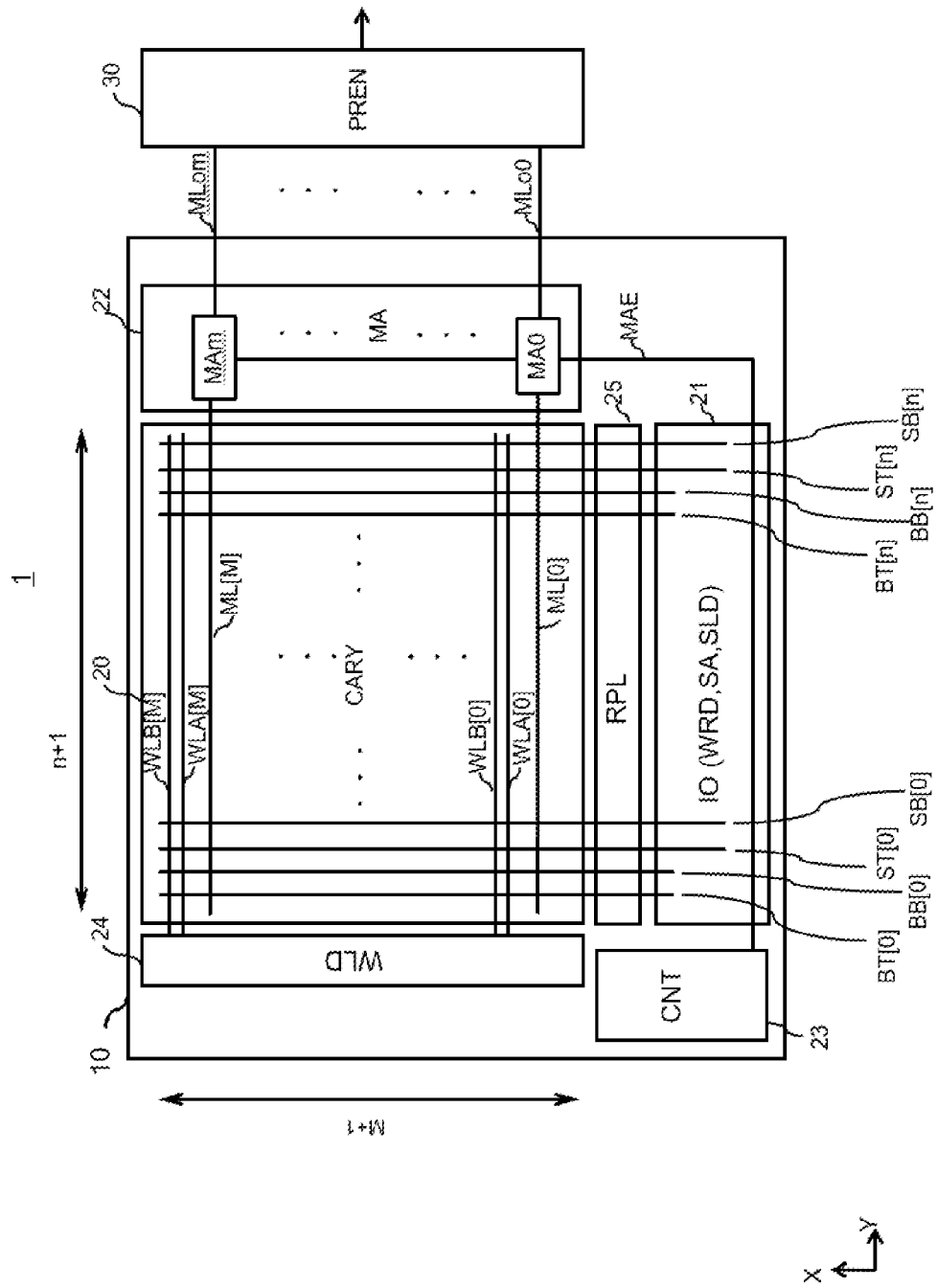
FIG. 3 is a block diagram showing the configuration of the TCAM device according to the first embodiment.

FIG. 3 is a diagram showing a configuration of a TCAM device according to the present embodiment. The TCAM device 1 includes a TCAM macrocell 10 and a priority encoder (PREN) 30. TCAM macrocell 10 includes a TCAM cell array (CARY) 20 (also referred to simply as a cell array), an input/output (I/O) circuit 21, a match amplifier circuit (MA) 22, a control logic circuit (CNT) 23, a word line driver (WLD) 24, and a replica circuit (RPL) 25.

The cell array 20 includes TCAM cells arranged in a matrix (M+1 rows; n+1 columns). In the cell array 20, the number of rows (the number of entries) is M+1 (M is a positive integer), and the number of columns (the number of bits of an entry) is n+1 (n is a positive integer).

For each column of the cell array 20, n+1 bit line pairs (BT[0], BB[0] to BT[n], BB[n]) and n+1 search line pairs (ST[0], SB[0] to ST[n], SB[n]) are provided. Corresponding to each row of the cell array 20, M+1 match lines (ML[0] to ML[M]), M+1 word lines for X cells (WLA[0] to WLA[M]), and M+1 word lines for Y cells (WLB[0] to WLB[M]) are provided. The word lines WLA[0]-WLA[M] are first word lines, and the word lines WLB[0] to WLB[M] are second word lines.

The IC circuit 21 includes a write driver WRD, a read sense amplifier SA, a search line driver SLD, and a replica circuit RPL. The write driver WRD supplies write data to the respective TCAM cells via the pair of bit lines BT and BB at the time of writing. The read sense amplifier SA amplifies data read from the TCAM cells via the pair of bit lines BT and BB and outputs the amplified data.

The search line driver SLD is also referred to as a selection circuit, and supplies search data to the respective TCAM cells via the search line pairs ST[0], SB[0] to ST[n], SB[n] at the time of search. As a result, when TCAM cell data coinciding with the inputted search data exists, TCAM cell data along at least one row of word lines WLA and WLB is selected. That is, the search line driver SLD and the search line pair (ST[0], SB[0]-ST[n], SB[n]) constitute a search circuit.

The control logic circuit (CNT) 23 controls the operation of the entire TCAM macrocell 10. For example, at the time of search, the control logic circuit 23 receives a search command and outputs control signals to the search line driver SLD and the match amplifier circuit MA to control the operations of the search line driver SLD, the match amplifier circuit MA, and the precharge circuit PRC. At the time of writing, the control logic circuit 23 outputs control signals to the write driver WRD and the word line driver WLD 24 to control the operations of the write driver WRD and the word line driver 24. The control logic circuit 23 outputs a control signal to the word line driver 24 and the sense amplifier SA for reading to control the operation of the word line driver 24 and the sense amplifier SA for reading.

The match amplifier circuit MA 22 includes a plurality of match amplifiers MA0 to MAm corresponding to the rows of the cell array, respectively. The inputs of the match amplifiers MA0 to MAm are respectively connected to the corresponding match lines ML (ML[0] to ML[M]), and the outputs of the match amplifiers MA0-MAm are respectively connected to the corresponding match signal outputting lines ML o(MLo0~MLom). At the time of searching, the match amplifiers MA0-MAm generate a detecting signal indicating whether or not the corresponding TCAM cell data matches the corresponding part of the inputted search data, based on the potential of the corresponding match lines ML (ML[0] to ML[M]), and outputs the detected signal to the corresponding match signal outputting lines MLo (MLo0~MLom). In this embodiment, the match amplifiers MA0-MAm include precharge circuits PRCs (not shown) for precharging the match lines ML[0] to ML[M] corresponding to the search. That is, the match amplifier circuit (MA) and the match lines ML (ML[0] to ML[M]) constitute a detection circuit.

The match amplifiers MA0 to MAm are connected to the control logic circuit 23 via a match line enable signal line MAE. The control logic circuit 23 is configured to activate (HIGH) or deactivate (low) the match line enable signal line MAE, as will be described later. The match amplifiers MA0-MAm do not output the detection signals when the match output enable signal line MAE is not activated, and output the detection signals in response to activation of the match output enable signal line MAE.

The replica circuit 25 defines the timings at which the control logic circuit 23 activates a match line enable signal line MAE, which will be described later, by a delay circuit provided therein.

The priority encoder (PREN) 30 is provided to select one match signal output line in accordance with a predetermined priority when a plurality of match signal output lines MLo0-MLom are set to signal levels indicating coincidence at the time of searching in the normal operation.

(Example of Configuration of Clock Generation Circuit and Replica Circuit)

Figure 4:
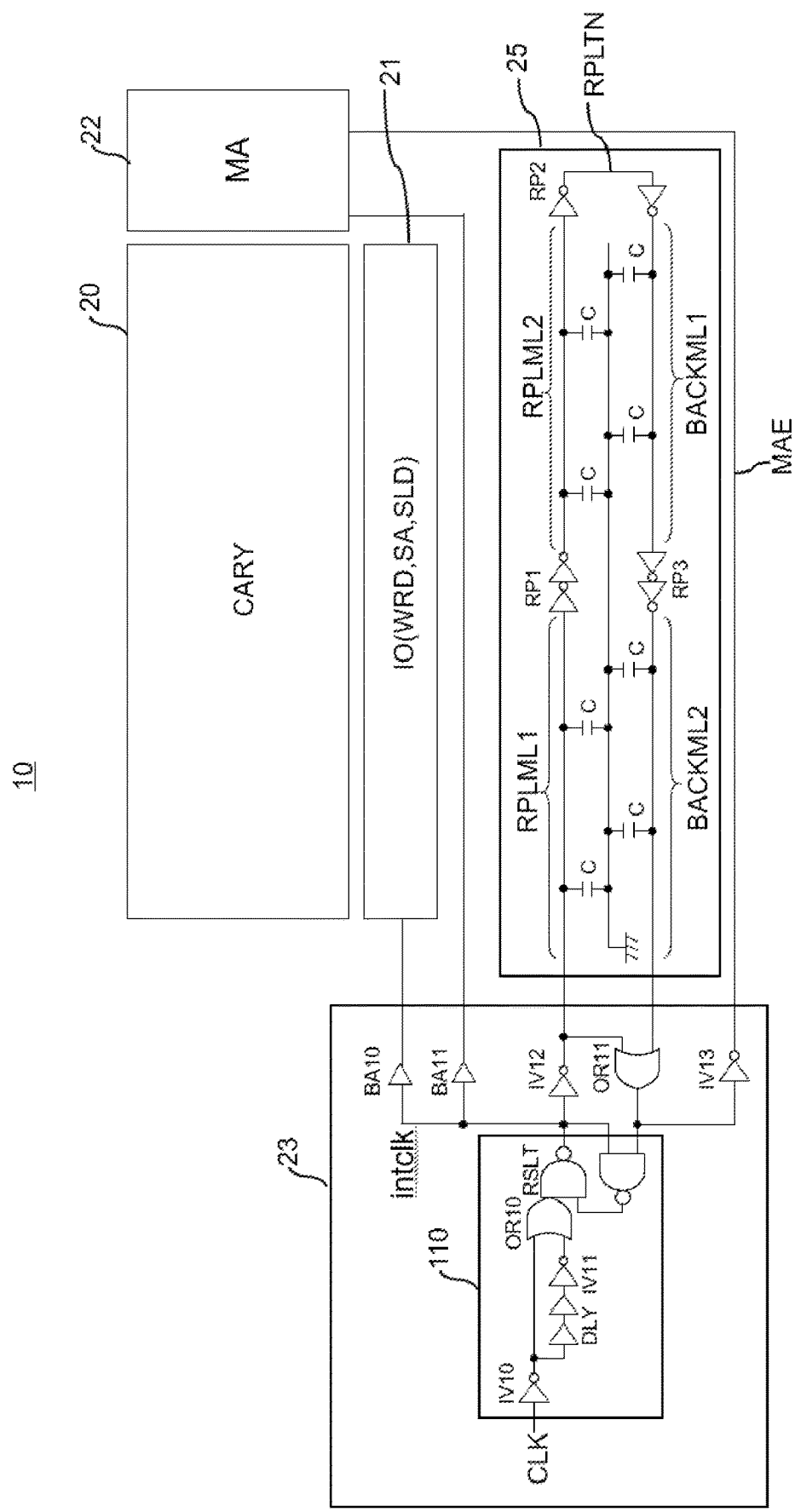
FIG. 4 is a schematic diagram showing the main parts related to the timing control in the TCAM macrocell.

FIG. 4 is a circuit diagram showing a main part related to the timing control in the TCAM macrocell 10 of FIG. 3, and the rest of the circuit diagram is omitted.

The control logic circuit 23 includes a clock generation circuit 110 that generates an internal clock signal intclk from the main clock signal CLK. The replica circuit 25 includes a first forward wiring RPLML1, a repeater RP1, a second forward wiring RPLML2, a repeater RP2, a folded wiring RPLTN, a first return wiring BACKML1, a repeater RP3, and a second return wiring BACKML2. These are connected in series and connected to a control logic circuit 23. This series of paths is called a replica path RPLP.

The clock generation circuit 110 includes inverters IV10 to IV13, OR circuits OR10 to OR11, a delay circuit DLY, a set/reset latch circuit RSLT, and buffer amplifiers BA10 to BA11.

The main clock signal CLK is a clock signal that periodically transitions between two states of LOW (low potential state) and HIGH (high potential state). The internal clock signal intclk generated based on the main clock signal CLK is connected to the I/O circuit 21 via the buffer BA10, and is connected to the match amplifier 22 via the buffer BA11. In response to the HIGH assertion of the internal clock signal intclk, the search line driver SLD in the I/O circuit 21 operates, and the match amplifier 22 turns off the precharge of the match line ML.

On the other hand, with respect to the replica circuit 25, the first forward line RPLML is shifted to the low level by the inverter IV12. The repeaters RP1 to RP3 performs a regeneration operation or a repeat operation for outputting a LOW or HIGH signal depending on whether the inputted signal is in a LOW or HIGH state. For example, the repeater RP1 that has detected that the first forward wiring RPLML has become LOW transitions the second forward wiring RPLML to LOW.

The wirings and repeaters constituting the replica path RPLP operate so that the first forward wiring ML1 and the second return wiring BACKML2 are at the same potential by the interlocking of the above-described voltage transitions. When both the first forward wiring RPLML and the second return wiring BACKML2 become LOW, the OR-circuit OR11 outputs LOW. In response to this, the reset latch circuit RSLT in the clock generation circuit 110 is reset, and the internal clock signal intclk is deasserted low. When the OR circuit OR11 outputs LOW, the match-line enable signal line MAE is asserted to HIGH through the IV13.

Here, since a plurality of capacitors C are connected to the replica path RPLP as capacitive loads, a delay depending on the wiring capacitance occurs in voltage transitions of the respective wires in the replica path RPLP. Therefore, a predetermined delay occurs from the time when the internal clock signal intclk is asserted to the HIGH to the time when the internal clock signal intclk is deasserted to the low level by the set/reset latch circuit RSLT by the signal passing through the replica path RPLP. The main function of the replica circuit 25 is to set the delay time longer than the time from the start of the operation of the search line driver SLD to the determination of the state of the match line ML, that is, to replica the timings of the state change of the match line. Since the match line enable signal line MAE is activated after the state of the match line ML is determined by the operation of the replica circuit 25, the match amplifier 21 can take in the result of the match operation at desired timings.

In the design of the replica circuit as described above, the inventors have found the following problems. That is, in the leading edge process, the resistance of the wiring is increased by miniaturization of the wiring. Although the search operation of the TCAM is rate-limited by the operation of the match line, the resistor of the match line increases with the miniaturization of the interconnection, so that the speed of the state-transition of the match line becomes slow. Then, the replica circuit needs to be designed to have a larger delay time in order to follow the delay time. The problems identified here are the following three. The first is that the transistor constituting the replica path RPLP flows through the replica path during the state transition, and the operating current increases. Second, the hot carrier deterioration of the transistor is remarkable due to the through current. Third, slow transitions appear as large variances in delay times due to variations in the logical thresholds of the transistors, affect in slower TCAM operation speeds and worse timing margins. The present invention solves these problems, and a more detailed description thereof follows.

(Examples of TCAM Macrocell Layouts)

Figure 5:
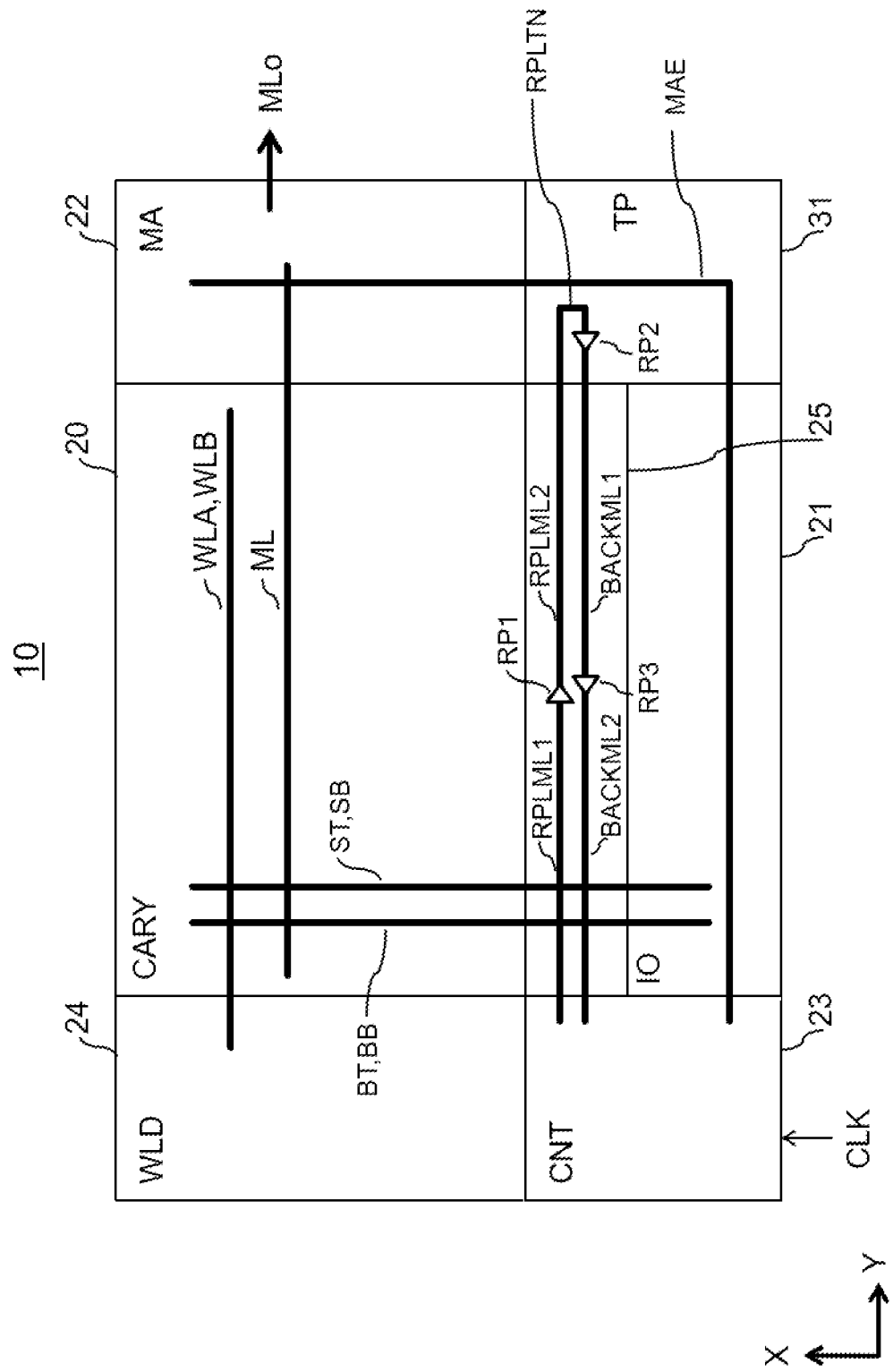
FIG. 5 conceptually illustrates the planar layout of TCAM macrocells.

FIG. 5 is a diagram conceptually showing a planar layout of the TCAM macrocell 10 of FIG. 4. Within TCAM of the macrocells 10, regions in which the word-line driver (WLD) 24, the TCAM cell array (CARY) 20, and the match amplifier circuit (MA) 22 are formed are sequentially arranged along the Y-direction. On the other hand, in the X direction, a formation region of the control logic circuit 23 is disposed below the word line driver WLD 24. In the Y direction, on the right side of the control logic circuit 23, the formation regions of the replica circuit 25 and the IC circuit 21 are arranged side by side in the X direction. A wiring region TP is arranged on the right side of the replica circuit 25 and the IC circuit 21 in the Y direction.

In the TCAM cell array 20, as an example, one match line ML is drawn, and the match lines ML are arranged along the Y-direction. In the TCAM cell array 20, a pair of word lines WLA and WLB arranged along the Y direction, a pair of bit lines BT and BB arranged along the X direction, and a pair of search lines ST and SB arranged along the X direction are further drawn. In the replica circuit 25, a first forward wiring RPLML1, a second forward wiring RPLML2, a first return wiring BACKML1, a second return wiring BACKML2, and repeaters RP1, RP3 are drawn. The first forward wiring RPLML1, the second forward wiring RPLML2, the first return wiring BACKML1, and the second return wiring BACKML2 are arranged along the Y-direction in parallel with the match line ML, respectively.

Since the length of the formation region of the TCAM cell array 20 in the Y direction and the length of the formation region of the replica circuit 25 in the Y direction are substantially the same, the wiring length of the outgoing path in the replica path RPLP, that is, the wiring length obtained by totaling the first outgoing path wiring RPLML1 and the second outgoing path wiring RPLML2, is designed to be substantially the same length as the wiring length of the match line ML. Similarly, the wiring length of the return path in the replica path RPLP, that is, the wiring length obtained by totaling the first return path wiring BACKML1 and the second return path wiring BACKML, is also designed to be substantially the same length as the wiring length of the match line ML. The length of the match line ML is determined corresponding to the width of the TCAM, i.e., the number of bits of one entry. That is, the replica circuit RPL can be regarded as being constituted by a wire (replica wire) for replicating the match line ML.

Here, a capacitance having a value substantially equal to the value of the wire capacitance including the parasitic capacitance of the match line ML is provided in the replica path RPLP by the parasitic capacitance, the capacitor, or the like.

In the replica path RPLP, the signal of the second forward path wiring RPLML2 is inputted to the return wiring RPLTN including the repeater RP2, and the repeater RP2 outputs the regenerated signal to the first return path wiring BACKML1. Here, the folded wiring RPLTN, the repeaters RP2, and the wiring of the input/output portion thereof are formed in the wiring area TP. In other words, a part of the replica circuit 25 is formed also over the wiring region TP.

Figure 6:
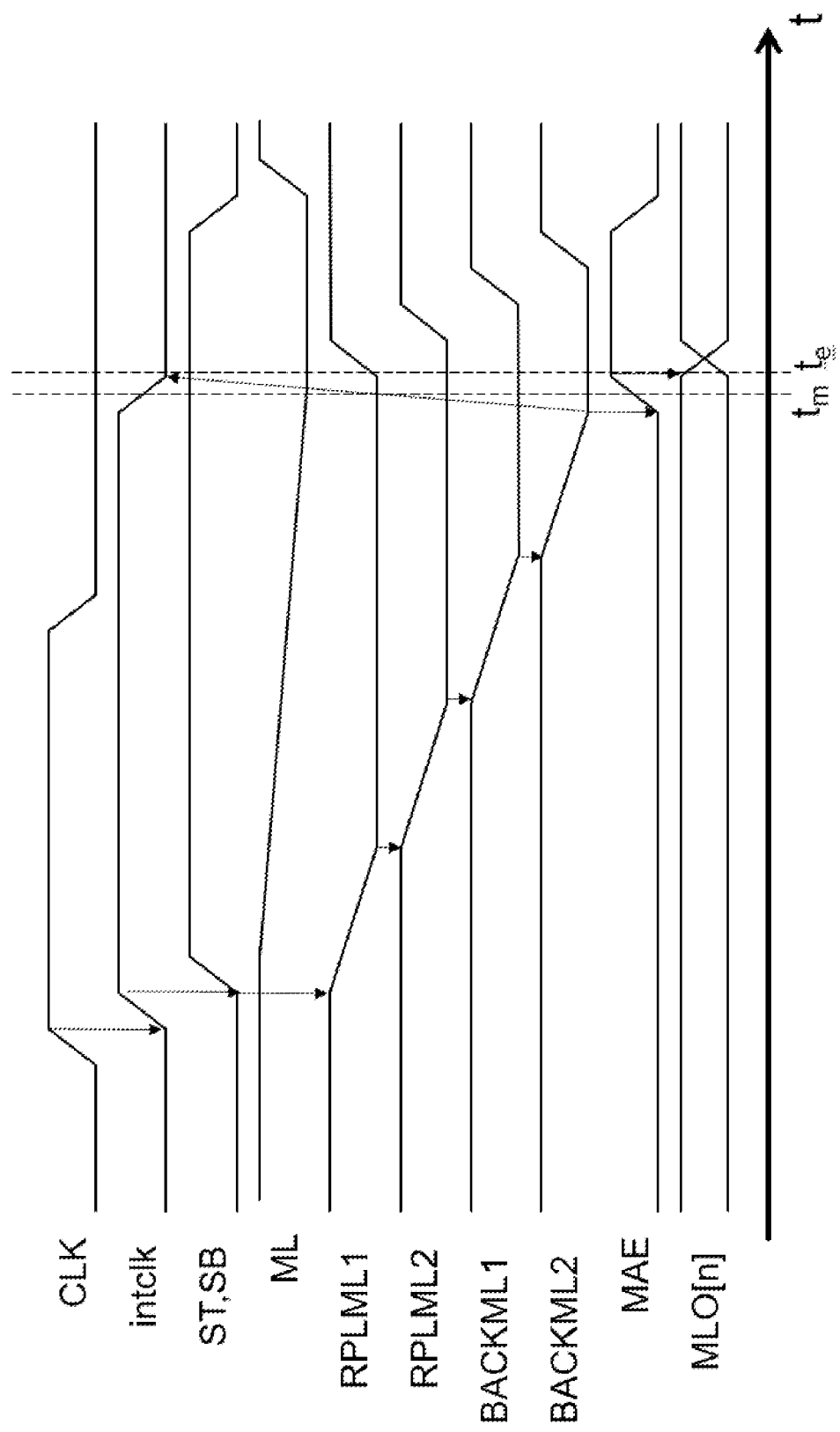
FIG. 6 is a timing chart showing the TCAM searching and matching operations and the operation timings of the replica circuit.

FIG. 6 is a timing chart showing the operation timings of the TCAM searching and matching operations and the replica circuits. Responsive to the transition of the main clock signal CLK from LOW to HIGH, the internal clock signal intclk changes from LOW to HIGH. In response to the change of the internal clock signal intclk to HIGH, the search lines ST and SB corresponding to the data to be searched are changed to HIGH, and when the data exists in the TCAM cell, discharging of the corresponding match line ML is started. At the same time, discharging of the first forward line RPLML1 including the loading capacitance C is started. When the potential of the first forward wiring RPLML1 is lower than the threshold value of the repeater RP1 due to the discharge, the repeater RP1 starts the discharge of the second forward wiring RPLML2 including the load capacitance C. When the potential of the second forward wiring RPLML2 falls below the threshold value of the repeater RP2, the repeater RP2 starts discharging the first return wiring BACKML1 including the load capacitance C. When the potential of the first return line BACKML1 falls below the threshold value of the repeater RP3, the repeater RP3 starts discharging the second return line BACKML2 including the load capacitance C. When the second return line BACKML2 changes to LOW through the voltage transition of the replica path RPLP as described above, the match line enable signal line MAE changes to HIGH in accordance with the circuit shown in FIG. 4. In response to the assertion of the match line enable signal line MAE, the match amplifier circuit operates to output a search result from the match signal output line MLo. Similarly, the reset latch circuit RST is reset in response to the change of the second return line BACKML2 to LOW, and the internal clock signal intclk changes from HIGH to LOW.

Here, by adjusting the capacitance of the load capacitance C to be applied to the replica path RPLP at the time of designing, the delay timing of voltage transitions is defined so that the timing to at which the match line enable signal line MAE is asserted becomes later than the timing tm at which the potential of the match line ML is determined to be a low potential as a search result. As a result, it is possible to prevent the match amplifier 22 from taking in data in a state where the voltage of the match lines ML is uncertain, and from outputting an inaccurate search result.

The advantages of the replica path RPLP including the repeaters RP1 to RP3 are described below. As described above, the replica path RPLP defines the timing by using the timing at which the potential of the replica path transitions from HIGH to low. However, signals in the middle of transitions whose potentials are neither HIGH nor state cause a through current to flow through the gates of the transistors included in the circuits. Therefore, the TCAM macro cell 10 requires a larger operating current, which prevents the TCAM macro cell 10 from consuming less power. In addition, the through current causes a large number of hot carriers in the transistor included in the circuit, which deteriorates the characteristics of the transistor. In addition, since the variation of the threshold value in the circuit is greatly affected, it is necessary to increase the time and voltage margin in the circuit operation, which also hinders the improvement of the operation speed. By providing the repeaters RP1 to RP3 in the replica path RPLP as in the present embodiment, it is possible to shorten the transition time of the potential per wire constituting the replica path RPLP. In other words, desired timings can be defined by transitions of potentials having a large slope and a large slew rate, so that it is possible to provide the TCAM macrocell 10 which has low power dissipation, high-speed operation, and high reliability.

Figure 7:
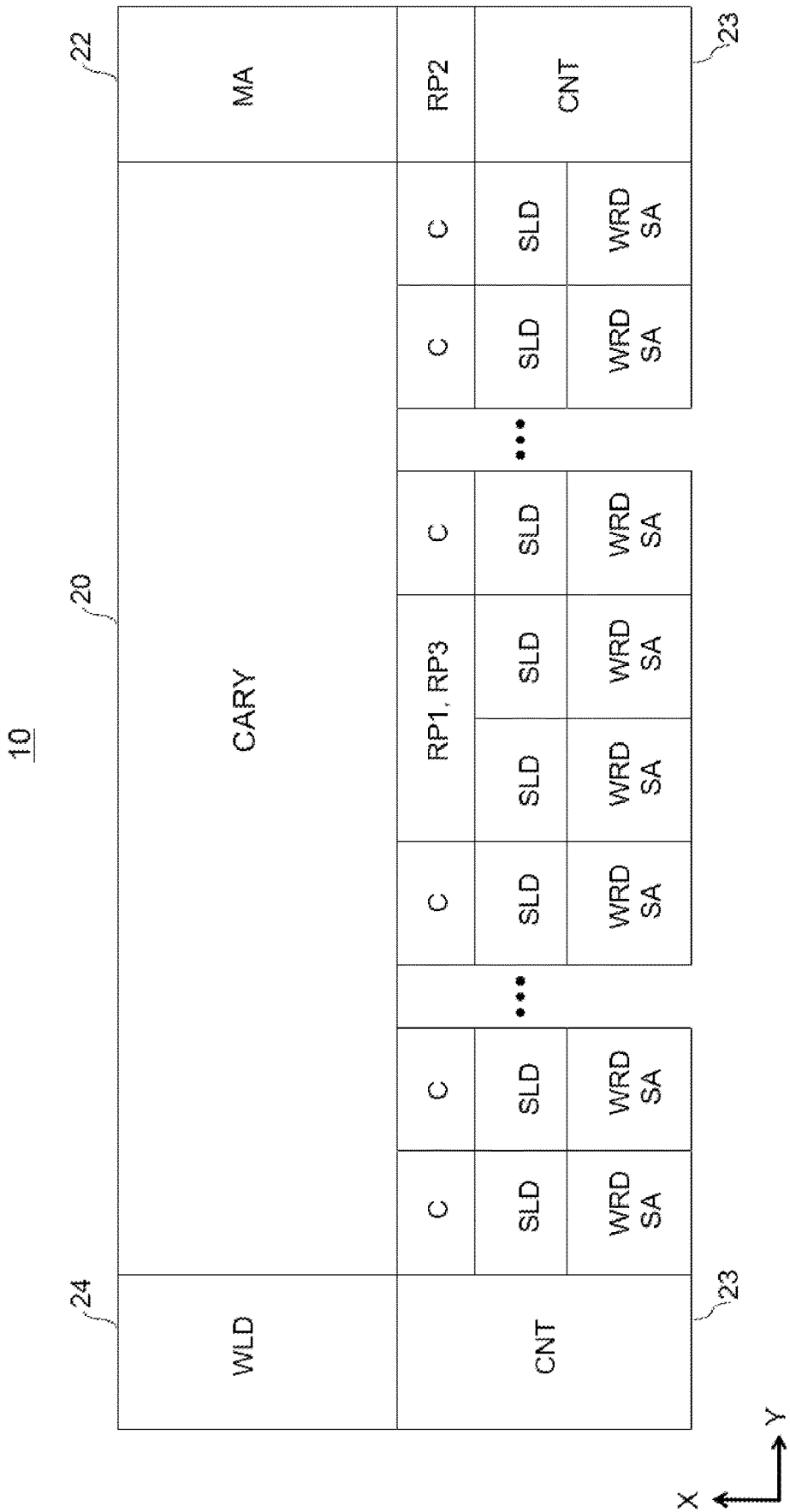
FIG. 7 is a schematic diagram illustrating the structure of TCAM macrocell using cells arranged in a grid pattern.

FIG. 7 is a conceptual diagram of a cell layout of the TCAM macrocell 10 according to the present embodiment. FIG. 7 illustrates the positional relation of each circuit or element by looking at each circuit or element constituting the TCAM macrocell 10 as one cell and arranging each cell in a grid pattern. FIG. 7 shows that each of the word line driver WLD, the search line driver SLD and the sense amplifier SA is constituted by a plurality of cells. The widths of the cells of the source line drivers SLDs, the word-line drivers WLDs, and the sense amplifiers SAs in the Y-direction correspond to the widths of one column of the TCAM cell array 20. That is, one cell corresponds to a pair of bit lines BT and BB and a pair of search lines ST and SB. The width of the loading capacitors C in the Y-direction per cell also correspond to the width of one column of the TCAM cell array 20. The repeaters RP1 and RP3 are arranged near the center of the widths of the TCAM cell arrays 20 as viewed in the Y-axis directions. In the present embodiment, the repeaters RP1 and RP3 are formed in regions corresponding to two cells of the load capacitors C. The control logic circuit 23 is distributed not only at a position along the word line driver 24 in the X direction but also at a position along the match amplifier circuit 22 and the repeater RP2 in the X direction. This is because, among the circuit elements constituting the control logic circuit, the circuit elements related to the control of the match amplifier circuit 22 are desirably arranged around the match amplifier circuit 22 in some cases.

In addition, according to FIG. 7, the load capacitances C and the repeaters RP1 to RP3 in the replica path RPLP are arranged between the TCAM cell array 20 and the search line drivers SLD. As a result, when the search lines ST and SB are activated and the potential of the match line ML rises in conjunction with the coupling effect, the potential of the RPLP wire in the replica path, for example, RPLML1, is also raised by the coupling effect, so that the potential of the replica path RPLP can follow the potential variation of the match lines ML.

Figure 8:
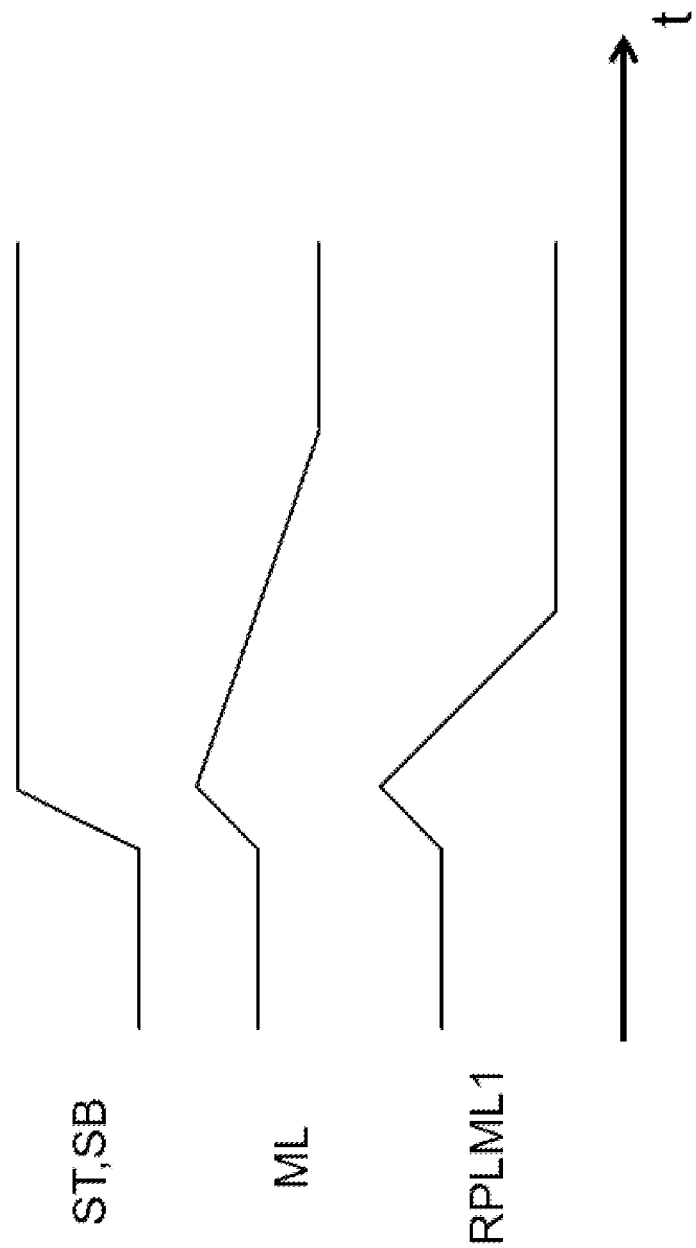
FIG. 8 is a timing chart showing the case where the potential of the match line rises due to the effect of coupling with the search line.

FIG. 8 is a timing chart showing a case where the potential of the match line ML rises due to the influence of coupling with the search lines ST and SB. When the potentials of the search lines ST and SB change from LOW to HIGH, the match line ML in the HIGH state becomes a higher potential state. Therefore, the time until the match line ML is discharged in the match operation and the potential becomes the LOW state becomes longer. Since the potential of the RPLP wires in the replica path, e.g., the RPLML1, rises due to the same coupling effect, the time required for the potential to go to the low-state becomes longer in conjunction with the coupling effect. The timing of asserting the match line enable signal line MAE can be delayed.

(Load Capacity and Repeater Details)

Figure 9:
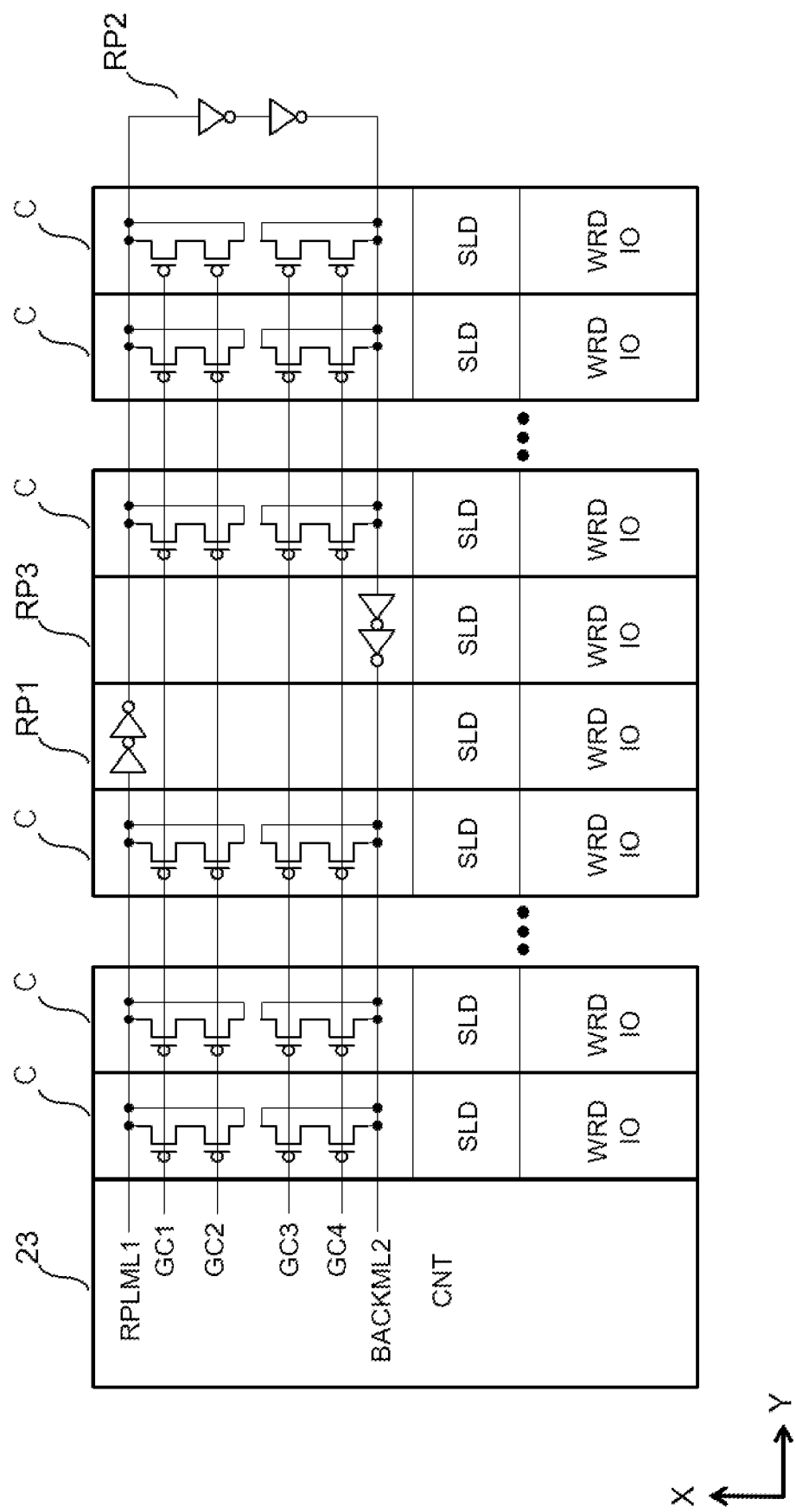
FIG. 9 is a diagram showing an exemplary cell layout of the replica path RPLP.

FIG. 9 is a diagram illustrating exemplary cell layouts of the replica path RPLP. FIG. 9 is a conceptual diagram of the cell layout of FIG. 7, which has been described in detail focusing on the IO circuit 21, the control logic circuit 23, and the replica circuit 25. In the embodiment shown in FIG. 9, the load capacitance C is realized by the gate capacitance of the PMOS transistor. The gate voltages of the PMOS transistors can be controlled by the potentials of the gate control lines GC1 to GC4 connected to the control logic circuits 23. Therefore, the load capacitance C can be changed by changing the voltages applied to the gates of the PMOS transistors. In this embodiment mode, the load capacitor C is realized by a PMOS transistor, but the load capacitor C can also be realized by a NMOS transistor. Each of the repeater RP1 and the repeater RP3 is formed in a cell having the same area as that of the load capacitor C.

The main effects of the TCAM macrocell 10 according to the present embodiment are as follows. In other words, a TCAM which consumes low power and operates at high speed can be realized by rigorous timing-design and high reliability of operation.

Modification of the Inverter of Embodiment 1

Figure 10:
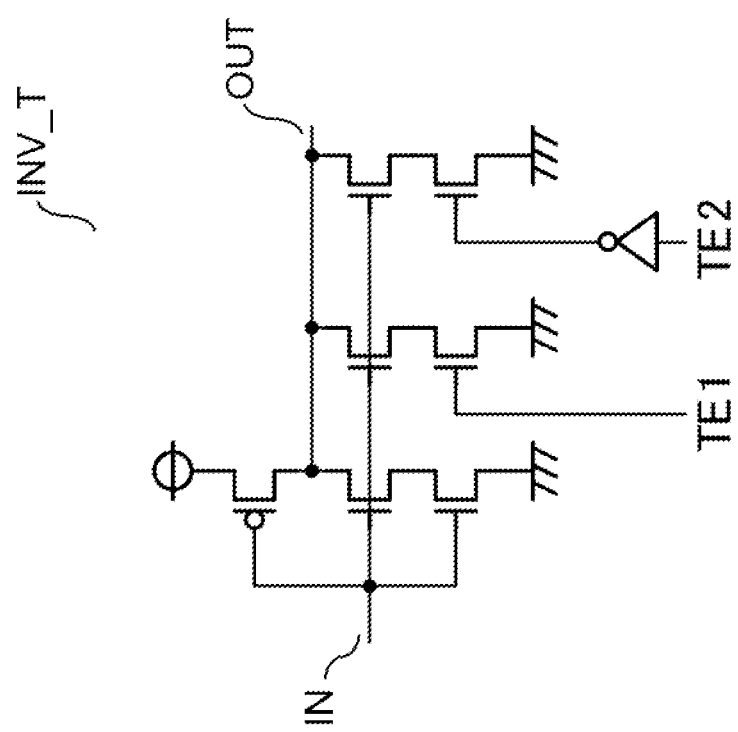
FIG. 10 is a circuit diagram showing an example of the configuration of inverters with test terminals in a TCAM cell array according to a modification of the first embodiment.

Referring back to FIG. 4, the TCAM macrocell 10 according to the first embodiment includes a plurality of inverters in circuits defining predetermined timings. Specifically, it is an inverter IV12 and inverters constituting repeaters RP1 to RP3. FIG. 10 shows a configuration example of an inverter INV_T with a test terminal, which is a modification example of these inverters. The inverter INV_T with a test terminal of FIG. 10 is a circuit for discharging the output node OUT when the potential of the input node IN is HIGH and for charging the output node OUT when the potential of the input node IN is low.

Here, the test terminal inverters INV_T are circuits capable of variably controlling drivability, that is, the capability of charging and discharging the output nodes OUT, in other words, the output current, by the test terminals TE1 and TE2. During normal operation, both TE1 and TE2 are low. In the TCAM search operation, the state in which the match line ML is high-impedance needs to be read, but when a current leak occurs in the match line ML, the match line ML becomes low regardless of the search result, and an erroneous search result may be outputted. This variant makes it possible to test the presence or absence of this current leakage. More specifically, when the test terminal TE1 is low and the test terminal TE2 is HIGH, the speed at which the output nodes are discharged is reduced, that is, the drivability of the inverters is reduced, and the timing delay of the replica path RPLP becomes longer. As a result, the timing at which the match line enable signal line MAE is asserted can be arbitrarily delayed, and it can be determined whether or not an abnormality such as current leakage occurs in the match line ML by comparison with the output result at the time of normal operation.

On the other hand, when the test terminal TE1 is set to HIGH and the test terminal TE2 is set to low, the speed at which the output node is discharged is improved, that is, the inverter node drivability is increased, and the timing delay of the replica path RPLP is further increased. As a result, the timing at which the match line enable signal line MAE is asserted can be made arbitrarily fast, and the operation marginality of TCAM macrocell 10 can be determined by comparing the output result with the output result at the time of normal operation.

According to the present modification, it is possible to test whether or not an abnormality occurs in the operation of the match line ML. In addition, the operation margin of TCAM macrocell 10 can be tested.

Although the invention made by the inventor has been specifically described based on the embodiment, the present invention is not limited to the embodiment already described, and it is needless to say that various modifications can be made without departing from the gist thereof.

What is claimed is:

1. A content addressable memory (CAM) comprising:
   a plurality of CAM cells;
   a plurality of word lines coupled to the plurality of the CAM cells respectively;
   a plurality of bit lines coupled to the plurality of the CAM cells respectively;
   a plurality of search lines coupled to the plurality of the CAM cells respectively;
   a plurality of match lines coupled to the plurality of the CAM cells respectively;
   a match amplifier coupled to the plurality of the match lines;
   an output select circuit configured to select and output at least one output of the match amplifier; and
   a replica circuit configured to specify timings of the output by the output select circuit,
   wherein the replica circuit includes:
      a replica wiring formed in parallel with the plurality of the match lines;
      a plurality of delay elements coupled with the replica wiring; and
      a plurality of repeater elements disposed in a path of the replica wiring,
   wherein the replica circuit further includes an output terminal configured to supply the replica wiring with an output voltage and an input terminal configured to input an input voltage,
   wherein the replica wiring comprises:
      a first area coupled to the output terminal;
      a second area coupled to the input terminal; and
      a third area neither coupled to the output terminal nor the input terminal, and wherein the plurality of the repeater elements includes:
      a first repeater circuit disposed between the first area and the third area; and
      a second repeater circuit disposed between the third area and the second area.

2. The content addressable memory (CAM) according to claim 1, further comprising a search line driver configured to supply the match lines with voltages selectively,
   wherein the replica wiring is disposed between the plurality of CAM cells and the search line driver.

3. The content addressable memory (CAM) according to claim 1, wherein the timings of the output by the output select circuit is specified based on voltage transition timings to a low-level and a high-level of the input voltage.

4. The content addressable memory (CAM) according to claim 1, wherein the plurality of the delay elements includes:
   a first delay element disposed in the first area;
   a second delay element disposed in the second area; and
   a third delay element disposed in the third area.

\* \* \* \* \*